United States Patent
Shim et al.

(10) Patent No.: US 7,579,136 B2
(45) Date of Patent: Aug. 25, 2009

(54) MICROFLUIDIC DEVICE AND METHOD OF MANUFACTURING THE SAME

(75) Inventors: Jeo-young Shim, Yongin-si (KR); Soo-suk Lee, Suwon-si (KR); Sung-ouk Jung, Suwon-si (KR); Ji-na Namgoong, Yongin-si (KR); Kyu-tae Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 659 days.

(21) Appl. No.: 11/414,711

(22) Filed: Apr. 28, 2006

(65) Prior Publication Data

US 2006/0257627 A1 Nov. 16, 2006

(30) Foreign Application Priority Data

May 10, 2005 (KR) ...................... 10-2005-0038987

(51) Int. Cl.
*H01L 21/00* (2006.01)
*G03C 5/20* (2006.01)
*B29C 65/00* (2006.01)

(52) U.S. Cl. ...................... 430/312; 430/313; 430/314; 430/396; 156/44

(58) Field of Classification Search ................. 428/156; 427/532, 331; 430/320

See application file for complete search history.

(56) References Cited

OTHER PUBLICATIONS

Childs, William R. and Nuzzo, Ralph G., "Large-Area Patterning of Coinage-Metal Thin Films Using Decal Transfer Lithography," *Langmuir* (2005) 21: 195-202.

Delamarche, Emmanuel et al., "Patterned Delivery of Immunoglobulins to Surfaces Using Microfluidic Networks," *Science* (1997) 276: 779-781.

McDonald, Cooper J. and Whitesides, George M., "Poly(dimethylsiloxane) as a Material for Fabricating Microfluidic Devices," *Accounts of Chemical Research* (2002) 35(7): 491-499.

*Primary Examiner*—Jill Warden
*Assistant Examiner*—Timothy G Kingan
(74) *Attorney, Agent, or Firm*—Cantor Colburn LLP

(57) ABSTRACT

Provided is a method of manufacturing a microfluidic device in which coating film patterns made of a coupling agent are formed in microchannels. The method includes: forming the coating film patterns made of the coupling agent on a Si substrate; selectively oxidizing coupling agent-free regions of the Si substrate having thereon the coating film patterns made of the coupling agent using an oxidizing agent with an oxidation potential from 1 to 2 V; and adhering a PDMS (polydimethylsiloxane) microchannel structure to the selectively oxidized Si substrate to form the microchannels.

8 Claims, 5 Drawing Sheets

UVO-TREATED PDMS

MERCAPTOSILANE-ACTIVATED SUBSTRATE

KMnO₄       H₂O₂       TMAH

FIG. 6B

KMnO₄       H₂O₂       TMAH

MICROFLUIDIC DEVICE AND METHOD OF MANUFACTURING THE SAME

CROSS-REFERENCE TO RELATED PATENT APPLICATION

This application claims priority from Korean Patent Application No. 10-2005-0038987, filed on May 10, 2005, in the Korean Intellectual Property Office, the disclosure of which is incorporated herein in its entirety by reference.

FIELD OF THE INVENTION

The present invention relates to a method of manufacturing a microfluidic device, and more particularly, to a method of manufacturing a microfluidic device, comprising adhering a PDMS (polydimethylsiloxane) structure to a Si substrate on which a coating film made of a coupling agent for the introduction of biomaterials is formed.

DESCRIPTION OF THE RELATED ART

When PDMS (polydimethylsiloxane), which is a type of a plastic material, is mixed with a curing agent and the mixture is sintered in an embossing die with a predetermined shape, a PDMS mold with a recess corresponding to a projection of the embossing die is fabricated. Such a technique of fabricating a PDMS mold is a plastic processing technique, and can produce desired molding structures by any suitable method such as casting, injection molding, or hot-embossing.

For example, SU-8, which is a photosensitive material, is coated on a silicon wafer, followed by photolithography with a photomask, to create a master mold. When PDMS is cast from the master mold used as a template and sintered, a PDMS mold is completed.

Figure 1:
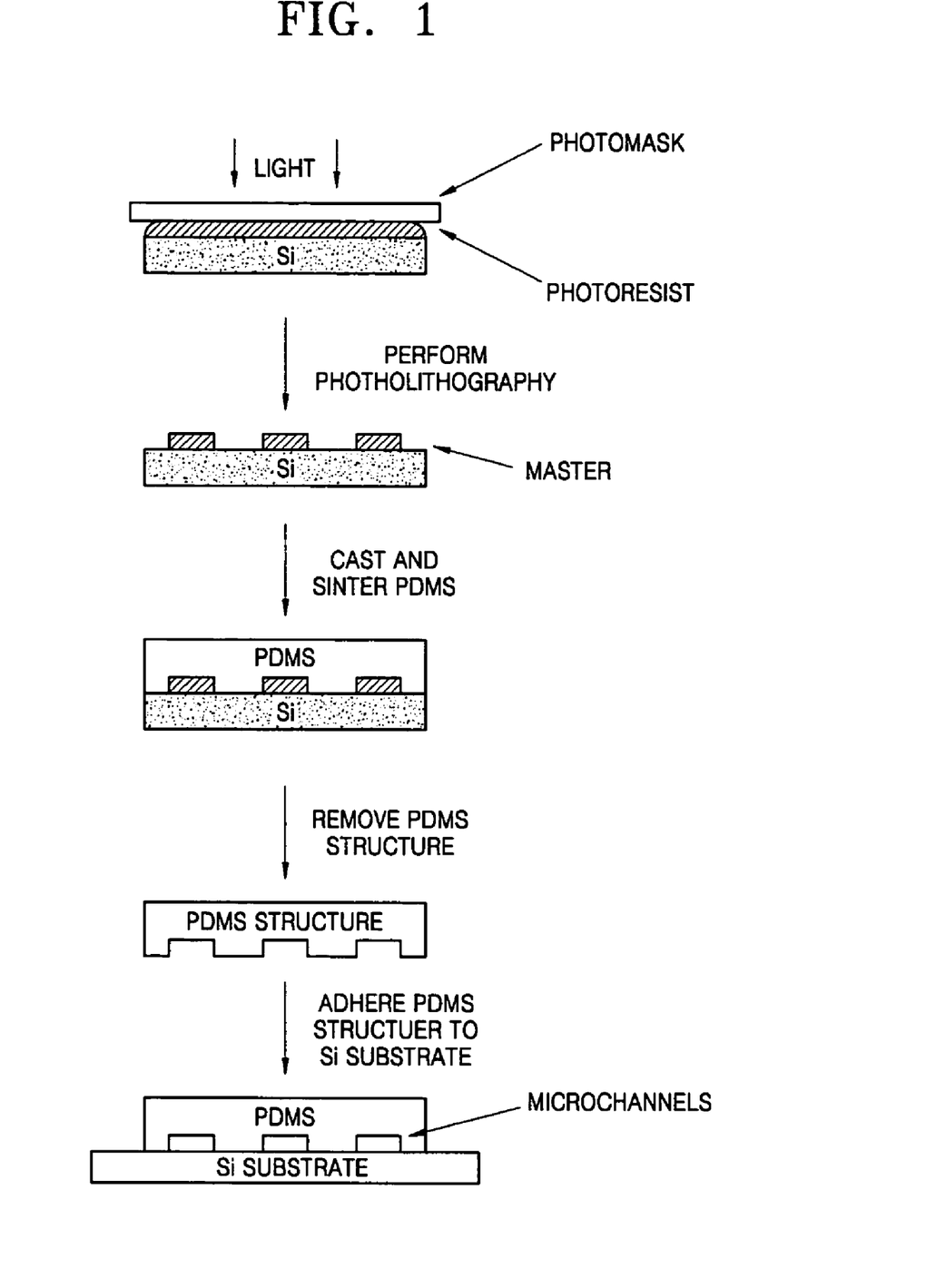
FIG. 1 is a schematic diagram illustrating a conventional method of manufacturing a PDMS (polydimethylsiloxane) microchannel structure.

PDMS is nontoxic, transparent, and less fluorescent, and thus, is specifically suitable for biological experiments in which fluorescence measurement is frequently performed. When a completed PDMS mold is surface-treated with plasma, a methyl group of the surface of the PDMS mold is oxidized to produce a silanol group (—Si—OH). Such a silanol-terminated PDMS mold can be adhered to a Si substrate such as a glass substrate, a quartz substrate, or a silicon wafer, as well as a PDMS substrate, and thus, can be widely used in fabrication of microfluidic devices. A PDMS microchannel structure and a method of manufacturing a microfluidic device using the same are schematically illustrated in FIG. 1.

To manufacture a microfluidic device, a recess-engraved PDMS microchannel structure must be adhered to a Si substrate. Furthermore, to adhere the PDMS microchannel structure to the Si substrate, the Si substrate as well as the PDMS microchannel structure must be treated with plasma or piranha (George M. Whitesides et al, *Poly(dimethylsiloxane) as a Material for Fabricating Microfluidic Devices*, Account of Chemical Research 2002, 35, 491-499). Still furthermore, to introduce a material such as a biomaterial into the microfluidic device, a coupling agent having an organic functional group must be attached onto the Si substrate in microchannels. However, the organic functional group of the coupling agent attached onto the Si substrate for biomaterial introduction is easily damaged by the plasma or piranha treatment conducted for the adhesion of the PDMS microchannel structure to the Si substrate. Thus, most conventional techniques of fabricating microfluidic devices adopt such a manner that a coupling agent having an organic functional group is introduced into microchannels after a PDMS microchannel structure is adhered to a Si substrate.

A method of introducing a coupling agent having an organic functional group into microchannels after adhering a PDMS microchannel structure to a Si substrate is disclosed in Hans Biebuyck et al, *Patterned Delivery of Immunoglobulins to Surfaces Using Microfluidic Networks*, Science 1997, 276, 779-781. According to this method, a PDMS microchannel structure is adhered to a Si substrate and a coupling agent is then allowed to flow in microchannels to form a coating film made of the coupling agent in the microchannels. Two different immunoglobulins (IgG) are allowed to flow in the microchannels in which the coating film made of the coupling agent is formed, to introduce the immunoglobulins into the microchannels, to thereby complete a microfluidic device for the detection of specific antigens. The presence of specific antigens can be detected by running an antigen-containing material in the channels.

According to the above method of fabricating a microfluidic device, however, since a coupling agent is introduced into microchannels after adhering a PDMS microchannel structure to a Si substrate, the degree of dispersion of the coupling agent in the microchannels increases, and it is difficult to immobilize the coupling agent to only desired regions in the microchannels, which makes it difficult to uniformly bind biomaterials to desired regions.

Figure 2:
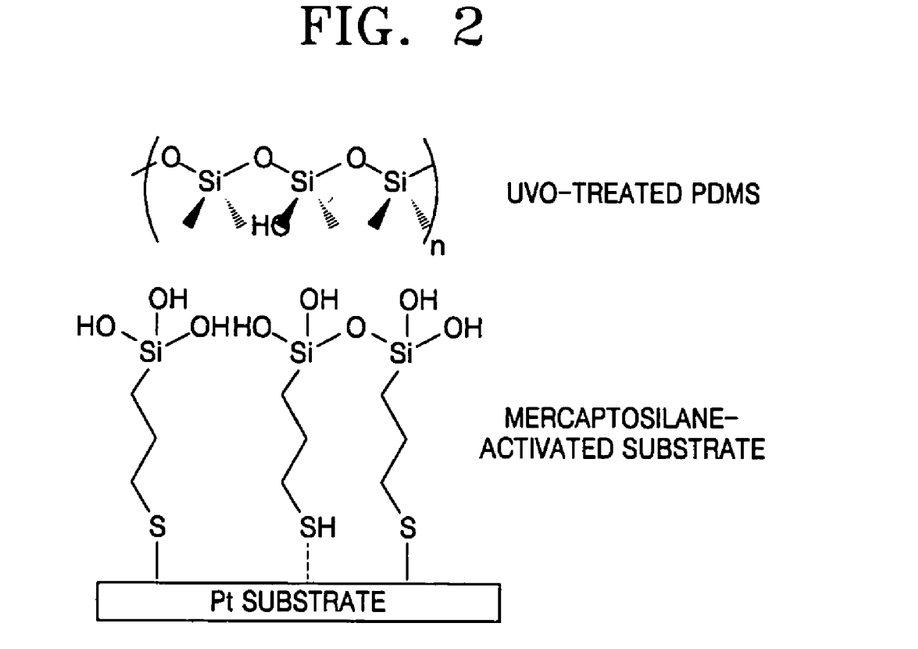
FIG. 2 is a view illustrating a platinum substrate bound with (mercaptopropyl)trimethoxysilane which is a thiol-terminated silane coupling agent, and UVO (UV/ozone)-activated PDMS.

Meanwhile, a method of adhering a PDMS microchannel structure to a platinum substrate instead of a Si substrate is disclosed in Wolliam R. Childs et al, *Large-Area Patterning of Coinage-Metal Thin Films Using Decal transfer Lithography*, Langmuir 2005, 21, 195-202. This method does not include the plasma surface treatment of the platinum substrate considering the characteristics of platinum but includes forming a coating film made of a thiol-terminated silane coupling agent, e.g., (mercaptopropyl)trimethoxysilane, on a platinum substrate, activating the silane group of the coupling agent into a silanol group by hydrolysis, and adhering the platinum substrate to a PDMS microchannel structure which has been previously surface-activated with UV/ozone (UVO) (see FIG. 2). That is, this method includes forming a coating film made of a coupling agent for biomaterial introduction on a platinum substrate and then adhering a PDMS microchannel structure to the platinum substrate, without the surface treatment of the platinum substrate with plasma or UVO. However, this method is complicated since the coating film made of the coupling agent for the adhesion of the PDMS microchannel structure is separately formed on the platinum substrate. In addition, it is difficult to accurately align the contact areas of the PDMS microchannel structure with the coating film made of the coupling agent for the adhesion of the PDMS microchannel structure.

SUMMARY OF THE INVENTION

While searching for solutions to the problems of the above conventional methods, the present inventors found a method of manufacturing a microfluidic device, including: forming a coating film made of a coupling agent for the introduction of biomaterials on a Si substrate and then adhering a PDMS (polydimethylsiloxane) microchannel structure to the Si substrate, without separately introducing an organic functional group for adhesion of the PDMS microchannel structure to the Si substrate.

Therefore, the present invention provides a method of manufacturing a microfluidic device, which can adhere a PDMS microchannel structure to a Si substrate with no damage to a coating film made of a coupling agent for biomaterial introduction on the Si substrate.

The present invention also provides a microfluidic device including microchannels, a coating film made of a coupling agent being formed in predetermined surface regions of the microchannels.

According to an aspect of the present invention, there is provided a method of manufacturing a microfludic device in which coating film patterns made of a coupling agent are formed in microchannels, the method including: forming the coating film patterns made of the coupling agent on a Si substrate; selectively oxidizing coupling agent-free regions of the Si substrate having thereon the coating film patterns made of the coupling agent using an oxidizing agent with an oxidation potential from 1 to 2 V; and adhering a PDMS microchannel structure to the selectively oxidized Si substrate to form the microchannels.

The formation of the coating film patterns made of the coupling agent may be performed using photolithography. In this way, the coating film patterns made of the coupling agent may be directly formed on the Si substrate. However, the coating film patterns made of the coupling agent may also be formed on $SiO_2$ oxide film patterns on the Si substrate by forming the $SiO_2$ oxide film patterns on the Si substrate and selectively coating the coupling agent on the $SiO_2$ oxide film patterns.

In the adhesion of the PDMS microchannel structure to the selectively oxidized Si substrate, contact areas of the PDMS microchannel structure contacting with the Si substrate may be treated with plasma.

The Si substrate may be a silicon wafer, a glass substrate, or a quartz substrate, but the present invention is not limited to the above-illustrated examples.

In the formation of the coating film patterns made of the coupling agent, the coupling agent may be a compound represented by Formula 1 below:

(1)

wherein,

A is SH, OH, CHO, $NH_2$, COOH, or epoxy;

m is an integer from 1 to 10; and $X^1$, $X^2$, and $X^3$ are each independently $C_{1-6}$ alkyl, $C_{1-6}$ alkoxy, or halogen, and at least one of $X^1$, $X^2$, and $X^3$ is $C_{1-6}$ alkoxy or halogen. However, the present invention is not limited to the above-illustrated example, and the coupling agent may also be selected from organic compounds known in the art that can be used as coupling agents for the introduction of biomaterials.

The compound of Formula 1 may be GAPS (ɣ-aminopropyltriethoxysilane), 3-glycidoxypropyltriethoxysilane, or 5,6-epoxyhexyltriethoxysilane.

The oxidizing agent, which can oxidize the surface of the substrate but cannot oxidize the costing film patterns made of the coupling agent, may be selected from the group consisting of hydrogen peroxide, potassium permanganate, tetramethylammonium hydroxide, and a combination thereof. However, the oxidizing agent is not limited provided that it has an oxidation potential from 1 to 2V.

According to another aspect of the present invention, there is provided a microfluidic device including microchannels, coating film patterns made of a coupling agent being disposed in predetermined surface regions of the microchannels.

In the microfluidic device, the coupling agent may be a compound represented by the above Formula 1 but the present invention is not limited thereto. The coupling agent may also be selected from coupling agents known in the art for the introduction of biomaterials. A biomaterial such as DNA, RNA, or protein may be bound to the coating film patterns made of the coupling agent.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

A method of manufacturing a microfluidic device according to the present invention is a method for adhering a PDMS (polydimethylsiloxane) microchannel structure to a Si substrate on which coating film patterns made of a coupling agent for the introduction of biomaterials are pre-formed. Only coupling agent-free regions of the Si substrate having thereon the coating film patterns made of the coupling agent are selectively oxidized. Thus, the present invention provides a method of manufacturing a microfluidic device, the method including: forming coating film patterns made of a coupling agent on a Si substrate; selectively oxidizing coupling agent-free regions of the Si substrate using an oxidizing agent with an oxidation potential from 1 to 2 V; and adhering a PDMS microchannel structure to the selectively oxidized Si substrate to form microchannels.

In the formation of the coating film patterns made of the coupling agent on the Si substrate, the coating film patterns made of the coupling agent are used to immobilize the Si substrate with a biomaterial selected according to the type of a desired microfluidic device. The coating film patterns made of the coupling agent can be formed on the Si substrate using photolithography known in the art.

The coating film patterns made of the coupling agent may be directly formed on the Si substrate, but may also be indirectly formed on the Si substrate via $SiO_2$ oxide film patterns interposed between the coating film patterns and the Si substrate. The $SiO_2$ oxide film patterns are used to measure the activity of the coupling agent fixed on the Si substrate of the microfluidic device. For this, the $SiO_2$ oxide film patterns must be disposed below the coating film patterns made of the coupling agent to bind a fluorescent material such as fluorescein with the coupling agent. In a case where the coating film patterns made of the coupling agent are directly formed on the Si substrate, even when a fluorescent material such as fluorescein is introduced onto the coating film patterns made of the coupling agent, a fluorescence signal is not detected due to fluorescence attenuation or interference. Thus, the formation of the $SiO_2$ oxide film patterns is not essential for the method of manufacturing the microfluidic device of the present invention, but is used as a quality control means for determining if the activity of the coupling agent is maintained in the microfluidic device.

Thus, according to an embodiment of the method of the present invention, the formation of the coating film patterns made of the coupling agent on the Si substrate includes forming $SiO_2$ oxide film patterns on the Si substrate and selectively coating the coupling agent on the $SiO_2$ oxide film patterns.

The formation of the $SiO_2$ oxide film patterns on the Si substrate and the selective coating of the coupling agent on the $SiO_2$ oxide film patterns can be achieved by the following method including: forming a $SiO_2$ oxide film on the Si substrate; forming photoresist patterns on the Si substrate having thereon the $SiO_2$ oxide film; selectively removing exposed portions of the $SiO_2$ oxide film through the photoresist patterns by etching to form the photoresist pattern present on the $SiO_2$ oxide film patterns; removing the photoresist patterns present on the $SiO_2$ oxide film patterns; forming photoresist patterns on oxide film pattern-free regions of the Si substrate; selectively binding the coupling agent to the $SiO_2$ oxide film patterns of the Si substrate; and removing the photoresist patterns from the Si substrate, but the present invention is not limited thereto.

In more detail, in the formation of the $SiO_2$ oxide film on the Si substrate, the $SiO_2$ oxide film may be formed to a predetermined thickness, preferably, 900~1,100 Å, on the entire surface of the Si substrate by thermal oxidation. The thermal oxidation can be performed by heating the Si substrate in a thermal oxidation apparatus such as a high-temperature furnace.

The $SiO_2$ oxide film formed on the Si substrate is patterned using a semiconductor process widely known in the art. For this, photoresist is coated on the entire surface of the $SiO_2$ oxide film formed on the Si substrate. Prior to the coating of the photoresist on the $SiO_2$ oxide film, the Si substrate may be surface-coated with a hydrophobic adhesion promoter such as HMDS (hexamethyldisilazane). By doing so, the adhesion of the photoresist to the Si substrate can be increased, thereby increasing the resolution of target photoresist patterns.

The Si substrate coated with the photoresist is exposed to light to form photoresist patterns. The exposure of the Si substrate to light is performed using a photomask having light-transmitting areas and light-shielding areas.

After the exposure to light, development is performed. The term "development" refers to a process for embodying patterns defined by exposure. When the photoresist is a positive photoresist, an exposed portion of the photoresist is dissolved in a developer during the development. On the other hand, when the photoresist is a negative photoresist, a non-exposed portion of the photoresist is dissolved in a developer during the development. That is, a desired photoresist pattern is formed by solubility difference in exposed and non-exposed portions of the photoresist. When the development is completed, photoresist patterns are formed on the $SiO_2$ oxide film covering the Si substrate. Since the photoresist patterns are disposed on only desired portions of the $SiO_2$ oxide film, the desired portions of the $SiO_2$ oxide film can be protected and unwanted portions of the $SiO_2$ oxide film can be removed. The unwanted portions of the $SiO_2$ oxide film on the Si substrate can be selectively removed by etching. The etching can be performed using a non-limiting etching solution such as a hydrofluoric acid (HF) solution or BOE (buffer oxide etcher, HF=6:1 or 5:1).

Figure 3A:
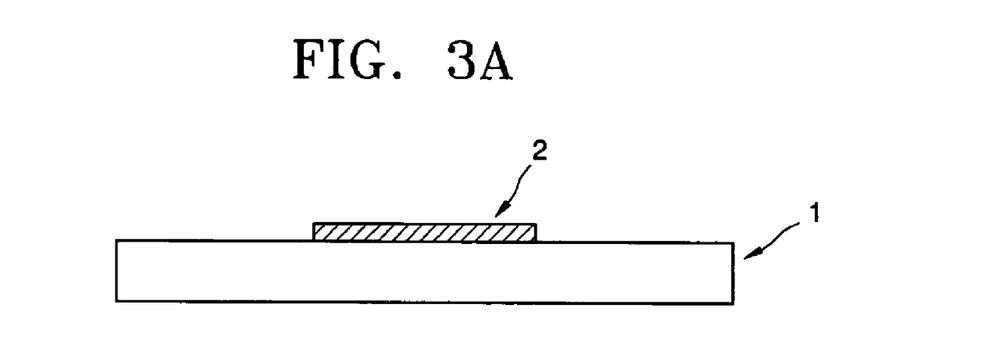
FIG. 3A is a sectional view illustrating a Si substrate on which a $SiO_2$ oxide film pattern is formed by photolithography.

After the unwanted portions of the $SiO_2$ oxide film are selectively removed, the photoresist patterns introduced for patterning are removed. The photoresist patterns can be removed using an organic solvent by a so-called "photoresist peeling" process. The organic solvent may be acetone and isopropanol, or a piranha solution. When needed, the photoresist patterns can also be removed using an asher. The photoresist peeling results in the Si substrate on which the $SiO_2$ oxide film patterns are formed. An example of a Si substrate on which a $SiO_2$ oxide film pattern is formed is illustrated in FIG. 3A.

To selectively deposit the coupling agent on the $SiO_2$ oxide film patterns formed on the Si substrate, it is necessary to protect oxide film pattern-free regions of the Si substrate with photoresist. Thus, photoresist patterns are formed on the oxide film pattern-free regions of the Si substrate in the same manner as the above-described photoresist patterning on the $SiO_2$ oxide film covering the Si substrate. That is, first, a surface of the Si substrate having thereon the $SiO_2$ oxide film patterns is pretreated with HMDS. Then, photoresist is coated on the pretreated surface of the Si substrate and exposed to light. The exposure to light is performed using a photomask having light-transmitting areas and light-shielding areas. The transmitting areas and the light-shielding areas of the photomask used herein must be inverted to those used in the above-described formation of the $SiO_2$ oxide film patterns since the $SiO_2$ oxide film patterns must be exposed. After the exposure to light is completed, development is performed.

Figure 3B:
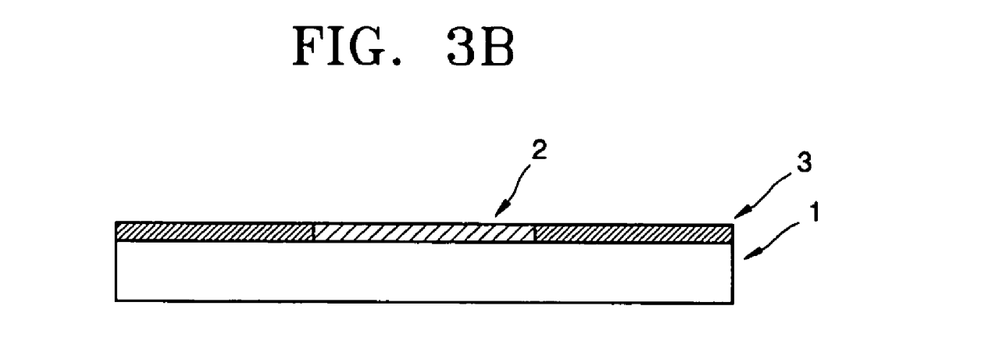
FIG. 3B is a sectional view illustrating a Si substrate on which photoresist patterns and a $SiO_2$ oxide film pattern between the photoresist patterns are formed by photolithography.

When the development is completed, the Si substrate covered with the desired $SiO_2$ oxide film patterns and the photoresist patterns between adjacent ones of the $SiO_2$ oxide film patterns is obtained. An example of a substrate covered with photoresist patterns and a $SiO_2$ oxide film pattern between the photoresist patterns is illustrated in FIG. 3B. The photoresist patterns are removed after selectively binding the coupling agent to the $SiO_2$ oxide film patterns.

The coupling agent that can be selectively bound to the SiO$_2$ oxide film patterns formed on the Si substrate may be a compound represented by Formula 1 below, e.g., GAPS (ɤ-aminopropyltriethoxysilane), 3-glycidoxypropyltriethoxysilane, or 5,6-epoxyhexyltriethoxysilane:

(1)

wherein,

A is SH, OH, CHO, NH$_2$, COOH, or epoxy;

m is an integer from 1 to 10; and

X$^1$, X$^2$, and X$^3$ are each independently C$_{1-6}$ alkyl, C$_{1-6}$ alkoxy, or halogen, and at least one of X$^1$, X$^2$, and X$^3$ is C$_{1-6}$ alkoxy or halogen.

The coupling agent of Formula 1 can be coated on the Si substrate having thereon the SiO$_2$ oxide film patterns using CVD (chemical vapor deposition), PVD (physical vapor deposition), or ALD (atomic layer deposition). When the coating of the coupling agent is completed, the photoresist patterns introduced for selective binding of the coupling agent to the SiO$_2$ oxide film patterns are removed. A Si substrate in which photoresist patterns are removed and one molecule of GAPS used as a coupling agent is selectively bound is illustrated in FIG. 4.

Figure 4:
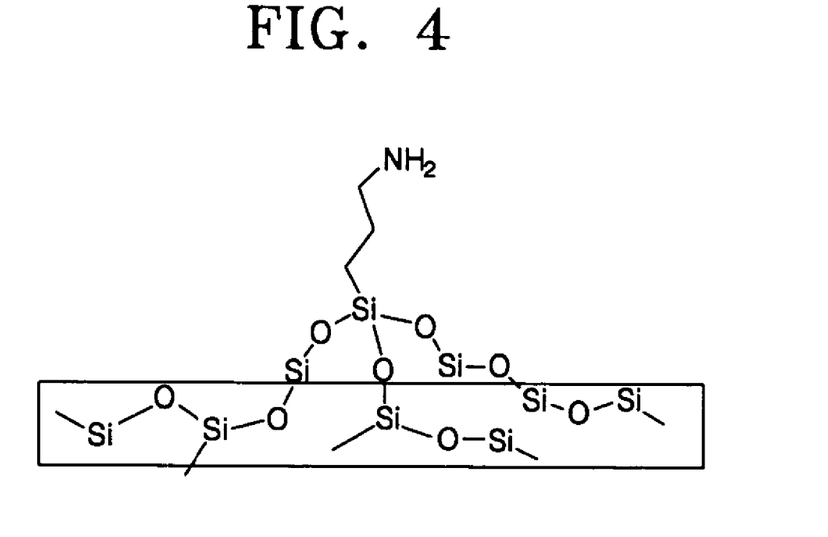
FIG. 4 is a view illustrating the selective binding of GAPS (ɣ-aminopropyltriethoxysilane) used as a coupling agent with a $SiO_2$ oxide film formed on a Si substrate.

When coating film patterns made of the coupling agent as shown in FIG. 4 are formed on the Si substrate by the above-described method, coating film pattern-free regions of the Si substrate are selectively oxidized with an oxidizing agent. Such an oxidation of the Si substrate is performed for subsequent adhesion of a PDMS microchannel structure to the Si substrate to complete a microfluidic device. The Si substrate thus oxidized can be adhered to plasma-activated contact areas of the PDMS microchannel structure. Since only the coating film pattern-free regions of the Si substrate are selectively oxidized without damaging to the coating film patterns made of the coupling agent, it is possible to form the coating film patterns made of the coupling agent on the Si substrate prior to adhering the PDMS microchannel structure to the Si substrate as described above.

The selective oxidation of the Si substrate can be performed using an oxidizing agent with an oxidation potential from 1 to 2 V. If an oxidizing agent with an oxidation potential less than 1 V is used, the oxidation of the Si substrate may be insufficient. On the other hand, if an oxidizing agent with an oxidation potential greater than 2 V, e.g., ozone is used, the activity of the coating film patterns made of the coupling agent formed on the Si substrate may be damaged. The oxidizing agent with an oxidation potential from 1 to 2 V may be selected from the group consisting of hydrogen peroxide, potassium permanganate, tetramethylammonium hydroxide, and a combination thereof, but the present invention is not limited to the above-illustrated examples. The oxidation potentials and reduced forms of the above-illustrated oxidizing agents are presented in Table 1 below.

TABLE 1

| Oxidizing agent | | reducing agent | E° (V) |
|---|---|---|---|
| O$_3$(g) + 2H+ + 2e$^-$ | ⇌ | O$_2$(g) + H$_2$O | 2.075 |
| H$_2$O + 2H+ + 2e$^-$ | ⇌ | 2H$_2$O | 1.763 |
| MnO$_4^-$ + 8H+ + 8e$^-$ | ⇌ | Mn$^{2+}$ + 4H$_2$O | 1.507 |

TABLE 1-continued

| Oxidizing agent | | reducing agent | E° (V) |
|---|---|---|---|
| NH$_3$OH$^+$ + 2H+ + 2e$^-$ | ⇌ | NH$_4^+$ + H$_2$O | 1.33 |
| SiO$_2$(s, quartz) + 4H+ + 4e$^-$ | ⇌ | Si(s) + 2H$_2$O | −0.990 |

In Table 1, the oxidizing power of the oxidizing agents increases from the bottom to the top, and the reducing power of the reducing agents increases from the top to the bottom.

Figure 5:
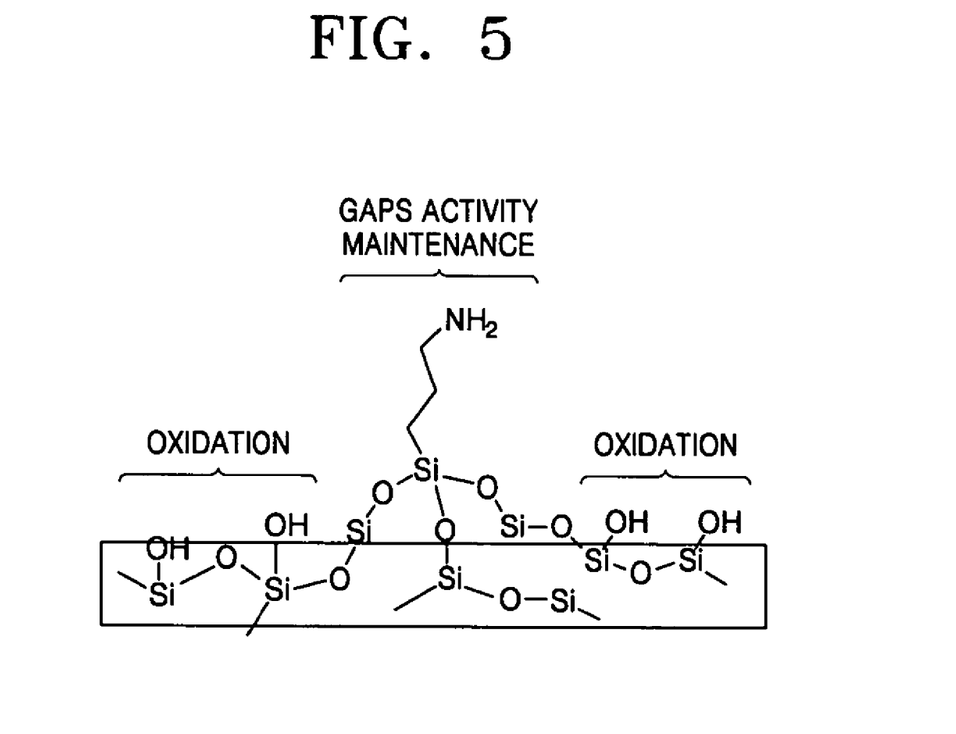
FIG. 5 is a view illustrating the oxidation of a Si substrate having thereon a coating film pattern made of a coupling agent using an oxidizing agent with an oxidation potential from 1 to 2 V.

The oxidation of the Si substrate having thereon the coating film patterns made of the coupling agent using the oxidizing agent can be performed by ultrasonic washing, dipping, or heating, but the present invention is not limited thereto. A resultant substrate structure obtained by selectively oxidizing a Si substrate having thereon a coating film pattern made of a coupling agent using the above-described method is illustrated in FIG. 5.

A PDMS microchannel structure the selectively oxidized Si substrate is adhered to the selectively oxidized Si substrate to complete a microfluidic device. The PDMS microchannel structure can be manufactured by any method known to those of ordinary skill in the art. In order to adhere the PDMS microchannel structure to the selectively oxidized Si substrate, the contact areas of the PDMS microchannel structure must be oxidized to form SiO$_2$. For this, plasma treatment, UVO (or ozone) treatment, etc. can be used. The SiO$_2$ surface of the PDMS microchannel structure can be adhered to the selectively oxidized surface of the Si substrate at a temperature of 60 to 80° C. under a pressure of 50N or more.

According to the above-described method, since a PDMS microchannel structure can be adhered to a substrate having thereon coating film patterns made of a coupling agent without affecting the activity of the coupling agent, it is possible to form the coating film patterns made of the coupling agent prior to adhering the PDMS microchannel structure to the substrate. This method can improve the degree of dispersion of the coating film patterns made of the coupling agent and can locally form the coating film patterns made of the coupling agent at desired regions in microchannels of a microfluidic device, unlike a conventional method in which coating film patterns made of a coupling agent are formed after adhering a PDMS microchannel structure to a substrate.

The present invention also provides a microfluidic device including microchannels, coating film patterns made of a coupling agent being disposed in predetermined surface regions of the microchannels. The coupling agent that can be used herein may be a compound represented by Formula 1 below, e.g., GAPS, 3-glycidoxypropyltriethoxysilane, or 5,6-epoxyhexyltriethoxysilane:

(1)

wherein,

A is SH, OH, CHO, NH$_2$, COOH, or epoxy;

m is an integer from 1 to 10; and

X$^1$, X$^2$, and X$^3$ are each independently C$_{1-6}$ alkyl, C$_{1-6}$ alkoxy, or halogen, and at least one of X$^1$, X$^2$, and X$^3$ is C$_{1-6}$ alkoxy or halogen.

A biomaterial such as DNA, RNA, or protein may be bound to the coating film patterns made of the coupling agent of the microfluidic device. Thus, the microfluidic device can be used as a lap-on-a-chip.

Hereinafter, the present invention will be described more specifically with reference to the following Examples. The following Examples are for illustrative purposes and are not intended to limit the scope of the invention.

EXAMPLES

Example 1

(1) Formation of Oxide Film on Wafer

An oxide film was formed to a thickness of 1,000 Å on a silicon wafer by thermal oxidation using Furnace SVF-200 (Celtron). The formation of the oxide film and all the following experiments were performed in a cleanroom-class 1000 with few or no dust particles.

The thickness of the oxide film was measured using NANOSPEC Model AFT 200 (NANOMETTICS). The NANOSPEC Model AFT 200 is a machine that measures the thickness of an oxide film using the principle that when light is incident in a silicon wafer, some light is reflected from the oxide film and some light passes through the oxide film and is then reflected from the silicon wafer. The thickness of the oxide film is measured using a phase difference between the light reflected from the oxide film and the light reflected from the silicon wafer. In the Example, the silicon wafer was placed on a sample stage of the NANOSPEC and the thickness of the oxide film at six points on the silicon wafer was measured to obtain an average thickness. As a result, an average thickness of the oxide film was 1,000 Å.

(2) Formation of Oxide Film Patterns on Wafer

The oxide film formed on the silicon wafer was subjected to a semiconductor process known in the art to form oxide film patterns.

First, the surface of the silicon wafer was pretreated with HMDS.

In detail, the surface of the silicon wafer was spin-coated with HMDS using a spin coater Model CEE 70 (CEE) in the following manner: initial coating at a rate of 500 RPM/5 sec and main coating at a rate of 4000 RPM/40 sec.

After the pretreatment with HMDS was completed, photoresist was spin-coated on the silicon wafer. For this, a positive photoresist, AZ1512, was used. The spin coating was performed using a spin coater Model CEE 70 (CEE) in the following manner: initial coating at a rate of 500 RPM/5 sec and main coating at a rate of 4000 RPM/40 sec. Immediately after the spin coating was completed, soft baking was performed to enhance an adhesion between the photoresist and the surface of the silicon wafer. The soft baking was performed at a 110° C. hot plate for 2 minutes.

After the soft baking was terminated, an exposure process for pattern formation was performed. The exposure was performed using a photomask having light-transmitting areas and light-shielding areas. The exposure is a step of a photolithography process widely known among semiconductor processes. The photomask was made to order by Micro Image Co., Ltd. The exposure was performed using EV 620 (Vision) with energy of 13 mJ for 4.5 seconds.

After the exposure was completed, development was performed using a developer, MIF 300K. After the development was completed, exposed portions of the oxide film which were not protected by the photoresist were selectively removed by etching. At this time, the etching was performed using a HF solution for about 3 minutes.

(3) Photoresist Peeling

After the exposed portions of the oxide film were selectively removed, the photoresist present on the resultant oxide film patterns was removed. This process is commonly called "photoresist peeling". The photoresist peeling was performed by sequentially cleaning with acetone and isopropanol (5 minutes for each). Then, residual photoresist was removed by cleaning with a piranha solution for 15 minutes.

(4) Formation of Photoresist Patterns for Selective Coating of GAPS

The operation (4) is the same as the operation (2) for forming the oxide film patterns, but is performed to protect oxide film pattern-free regions of the silicon wafer with photoresist to thereby selectively deposit a coupling agent on the oxide film patterns.

Like the operation (2), first, the surface of the silicon wafer was pretreated with HMDS to enhance an adhesion between the surface of the silicon wafer and photoresist to be coated and thus increase target pattern resolution. For this, the surface of the silicon wafer was spin-coated with HMDS using a spin coater Model CEE 70 (CEE) in the following manner: initial coating at a rate of 500 RPM/5 sec and main coating at a rate of 4000 RPM/40 sec.

After the pretreatment with HMDS was completed, photoresist was spin-coated on the silicon wafer. For this, a positive photoresist, AZ1512, was used. The spin coating was performed using a spin coater Model CEE 70 (CEE) in the following manner: initial coating at a rate of 500 RPM/5 sec and main coating at a rate of 4000 RPM/40 sec. Immediately after the spin coating was completed, soft baking was performed to enhance an adhesion between the photoresist and the surface of the silicon wafer. The soft baking was performed at a 110° C. hot plate for 2 minutes.

After the soft baking was terminated, an exposure process for pattern formation was performed. The exposure was performed using a photomask having transmitting areas and light-shielding areas. The transmitting and light-shielding areas of the photomask used herein were inverted to those of the photomask used in the operation (2). The photomask was made to order by Micro Image Co., Ltd. The exposure was performed using EV 620 (Vision) with energy of 13 mJ for 4.5 seconds. After the exposure was completed, development was performed using a developer, MIF 300K.

After the development was completed, the silicon wafer covered with the desired $SiO_2$ oxide film patterns and photoresist patterns between adjacent ones of the $SiO_2$ oxide film patterns was obtained.

(5) Formation of Coating Film Patterns Made of Coupling Agent

The silicon wafer was cleaned prior to coating with a coupling agent. The cleaning was performed using oxygen plasma to remove organic contaminants from the surface of the silicon wafer. The plasma treatment was performed using Model PDC-M-01 (Harrick) under the condition of 10.2 W for 5 minutes. Since the plasma treatment is a dry process, a separate dry process was not performed.

A coating film was formed by CVD using a coupling agent, GAPS. The CVD was performed at a temperature of 110° C. under a pressure of 60 mbar for 3 hours. After the CVD was completed, the photoresist patterns used for patterning were removed. For this, first, the silicon wafer was dipped in a methanol solution and then ultrasonically washed for 35 minutes. Then, the silicon wafer was ultrasonically washed with a MIF 300K solution for 5 minutes, acetone for 10 minutes, and isopropyl alcohol for 2 minutes, treated with an excess of deionized (DI) water, and dried. The drying was performed using a spin drier.

(6) Manufacturing of PDMS Microchannel Structure

Silgard 184 (Dow Corning) components A and B were mixed in a ratio of 10:1. The mixture was several times stirred with a glass bar and degassed in a vacuum oven for about 30 minutes. The resultant liquid PDMS was poured into a previously made microchannel mold and solidified at 70° C. for 30 minutes to obtain a PDMS microchannel structure.

(7) Adhesion of PDMS Microchannel Structure to Wafer

The PDMS microchannel structure manufactured in the operation (6) was surface-oxidized using oxygen plasma to produce a $SiO_2$ surface coating. The plasma treatment was performed using Model PDC-M-01 (Harrick) under the condition of 7.6 W for 1 minute. Since the plasma treatment is a dry process, a separate dry process was not performed.

Then, the silicon wafer having thereon the coating film patterns made of the coupling agent manufactured in the operation (5) was ultrasonically washed with a 10% (w/v) potassium permanganate aqueous solution for 2 minutes to selectively oxidize coupling agent-free regions of the silicon wafer. Then, the silicon wafer was cleaned with excess DI water and then dried with $N_2$ blowing. Then, the plasma-treated PDMS microchannel structure and the silicon wafer were contacted to each other and then baked at 70° C. under a low pressure for 60 minutes to thereby complete a microfluidic device in which the coating film patterns made of the coupling agent were formed in predetermined regions of microchannels.

Example 2

A microfluidic device was manufactured in the same manner as in Example 1 except that a 30% (w/v) hydrogen peroxide aqueous solution was used to selectively oxidize coupling agent-free regions of a silicon wafer.

Example 3

A microfluidic device was manufactured in the same manner as in Example 1 except that a 2.38% (w/v) tetramethylammonium hydroxide aqueous solution was used to selectively oxidize coupling agent-free regions of a silicon wafer.

Example 4

Microfluidic devices were manufactured in the same manner as in Example 1 except that silicon wafers were ultrasonically washed with a 10% (w/v) potassium permanganate aqueous solution for 5, 10, and 20 minutes, respectively, microfluidic devices were manufactured in the same manner as in Example 2 except that silicon wafers were ultrasonically washed with a 30% (w/v) hydrogen peroxide aqueous solution for 5, 10, and 20 minutes, respectively, and microfluidic devices were manufactured in the same manner as in Example 3 except that silicon wafers were ultrasonically washed with a 2.38% (w/v) tetramethylammonium hydroxide aqueous solution for 5, 10, and 20 minutes, respectively.

Comparative Example 1

Microfluidic devices were manufactured in the same manner as in Example 1 except that oxygen plasma instead of a potassium permanganate aqueous solution was used to selectively oxidize coupling agent-free regions of silicon wafers. The silicon wafers were treated with oxygen plasma using Model PDC-M-01 (Harrick) under the condition of 7.2 W for 0, 2, 5, 10, and 20 minutes, respectively.

Experimental Example 1

Activity Measurement of Coupling Agent

The activity of the coupling agent in the microfluidic devices manufactured in Examples 1-4 and Comparative Example 1 was measured to determine if the activity of the coupling agent was maintained in the microfluidic devices. For this, the PDMS microchannel structures were separated from the microfluidic devices manufactured in Examples 1-4 and Comparative Example 1 and the activity of the coupling agent present on the silicon wafers was measured.

The activity of the coupling agent was measured by labeling the coupling agent with fluorescein. The fluorescein labeling was performed using dipping.

First, fluorescein was dissolved in a DMF (dimethylformamide) solution to prepare a fluorescein solution (0.05 g/10 ml). The fluorescein solution and the silicon wafers were placed in reactors and incubated at 40° C. for 120 minutes. After the reaction was terminated, the silicon wafers were removed from the fluorescein solution and cleaned with DMF (×3, 10 minutes) and methanol (×3, 10 minutes). The silicon wafers were dried and the intensity of fluorescein coupled with the coupling agent on the silicon wafers was measured using GenePix 4000B scanner (Axon).

Figure 6A:
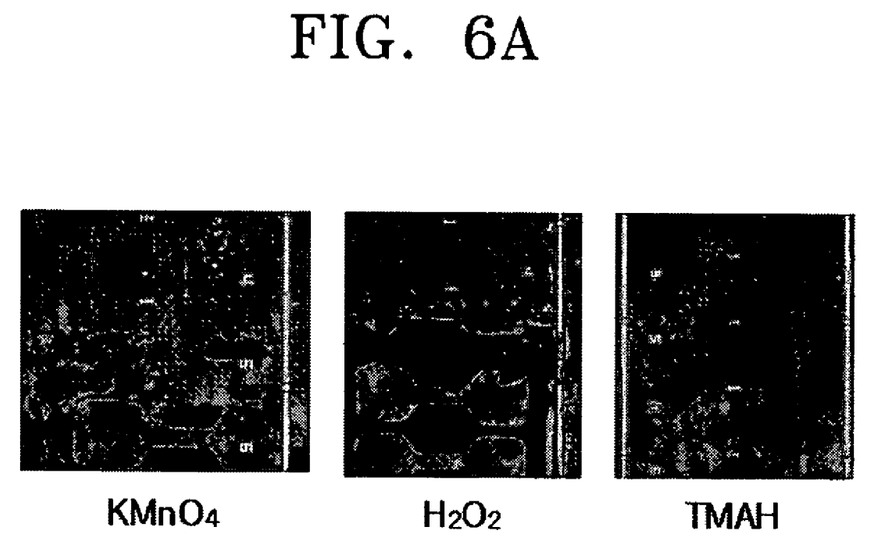
FIG. 6A shows fluorescent images from fluorescein-labeled surfaces of Si substrates for microfluidic devices selectively oxidized with potassium permanganate, hydrogen peroxide, and trimethylammonium hydroxide, respectively, according to the present invention.
Figure 6B:
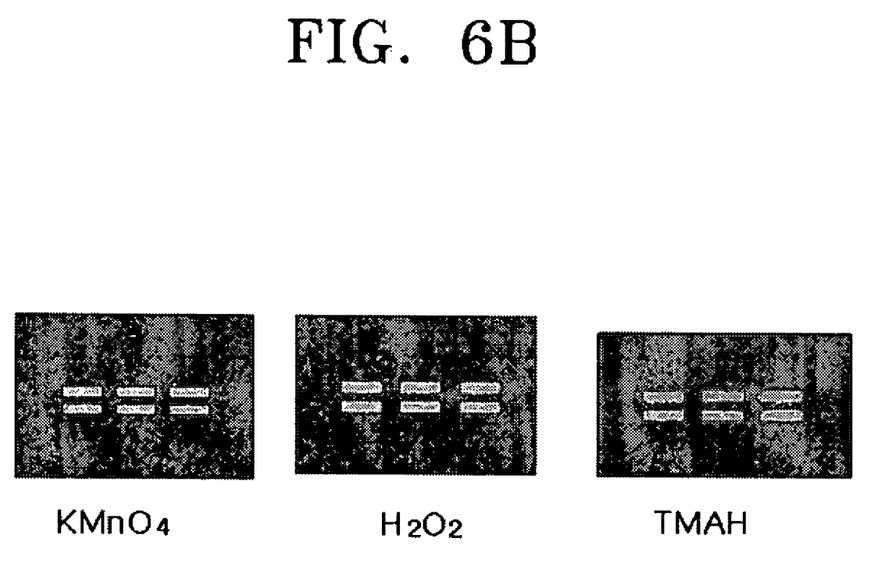
FIG. 6B shows enlarged images of single fluorescent spots of the fluorescent images of FIG. 6A.
Figure 7:
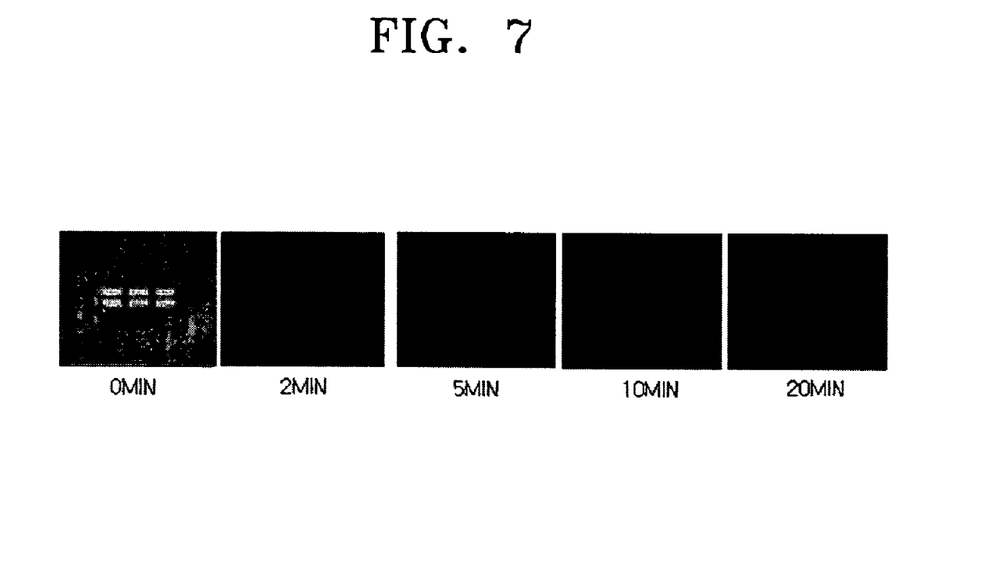
FIG. 7 shows fluorescent images from fluorescein-labeled surfaces of Si substrates having thereon coating film patterns made of a coupling agent when the Si substrates are treated with oxygen plasma.

The photographic images of Examples 1-3 are shown in FIG. 6A, and the photographic images of Comparative Example 1 are shown in FIG. 7. FIG. 6B shows enlarged images of single fluorescent spots of the photographic images of FIG. 6A. Fluorescence intensities from fluorescein-labeled surfaces of the silicon wafers of Examples 1-4 and Comparative Example 1 are shown in Table 2 below and FIG. 8.

TABLE 2

| Treatment time | Fluorescence intensity with respect to the treatment time of oxidizing agent | | | |
|---|---|---|---|---|
| | Oxidizing agent | | | |
| (min) | TMAH | $KMnO_4$ | $H_2O_2$ | $O_2$ plasma |
| 0 | 12050 | 12600 | 12120 | 13050 |
| 2 | 12020 | 10827 | 12043 | 160 |
| 5 | 13000 | 11500 | 11000 | 50 |
| 10 | 12400 | 12500 | 13070 | 45 |
| 20 | 500 | 9380 | 9900 | 50 |

Referring to FIG. 6A, in connection with the microfluidic devices manufactured by selectively oxidizing the silicon wafers with potassium permanganate, hydrogen peroxide, and trimethylammonium hydroxide, respectively, according to the present invention, fluorescence was observed at four spots of the center portion of each of the silicon wafers having thereon the coating film patterns made of the coupling agent. On the contrary, in connection with the microfluidic devices manufactured by selectively oxidizing the silicon wafers with oxygen plasma, no fluorescent spots were observed (see FIG. 7). These results reveal that the activity of a coupling agent on a silicon wafer is damaged by oxygen plasma treatment but a silicon wafer is selectively oxidized by potassium permanganate, hydrogen peroxide, and trimethylammonium hydroxide without damaging to the activity of a coupling agent on the silicon wafer. Therefore, it can be seen that only coupling agent-free regions of a silicon wafer having thereon coating film patterns made of a coupling agent can be selectively oxidized using an oxidizing agent with an oxidation potential from 1 to 2 V.

Figure 8:
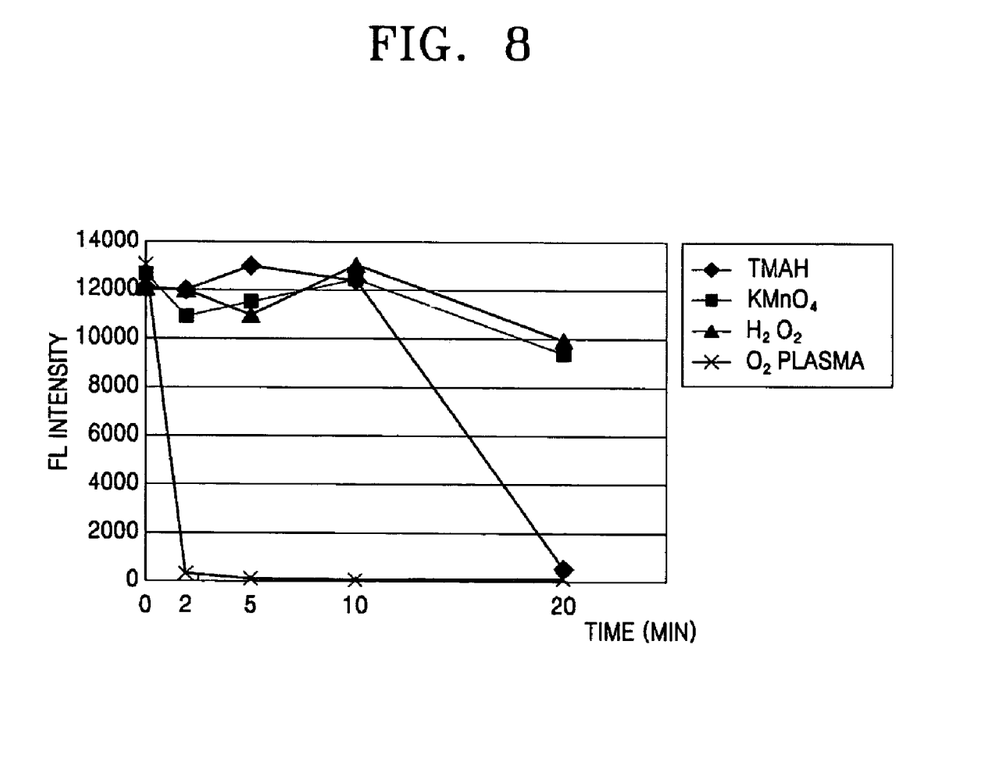
FIG. 8 is a graph illustrating fluorescence (FL) intensities from fluorescein-labeled surfaces of Si substrates having thereon coating film patterns made of a coupling agent when the Si substrates are treated with oxidizing agents, i.e., potassium permanganate, hydrogen peroxide, and trimethylammonium hydroxide, and with oxygen plasma during 2, 5, 10, and 20 minutes, to evaluate the activity of a coupling agent on the Si substrates.

FIG. 8 shows fluorescence intensities from fluorescein-labeled surfaces of the silicon wafers of Examples 1-4 and Comparative Example 1 with respect to the treatment time of potassium permanganate, hydrogen peroxide, trimethylammonium hydroxide, and oxygen plasma. Referring to FIG. 8, fluorescence intensities of Examples 1-4 were hardly changed while the treatment with potassium permanganate, hydrogen peroxide, and trimethylammonium hydroxide was continued for 10 minutes. However, when the silicon wafer was treated with trimethylmethylammonium hydroxide for 20 minutes, fluorescence intensity was remarkably reduced. In connection with Comparative Example 1, fluorescence was hardly observed even when the silicon wafer was treated with oxygen plasma for 2 minutes. These results reveal that the activity of a coupling agent is hardly damaged with respect to the treatment time of an oxidizing agent with an oxidation potential from 1 to 2 V, but is damaged by oxygen plasma treatment even for a short time.

As described above, according to a method of manufacturing a microfluidic device of the present invention, a substrate having thereon coating film patterns made of a coupling agent can be selectively oxidized using an oxidizing agent with an oxidation potential from 1 to 2 V. This enables the adhesion of a PDMA microchannel structure to a Si substrate on which coating film patterns made of a coupling agent for the introduction of biomaterials are pre-formed. Therefore, the degree of dispersion of the coupling agent in the coating film patterns made of the coupling agent can be enhanced, and the coating film patterns made of the coupling agent can be locally formed at desired regions in microchannels of a microfluidic device.

What is claimed is:

1. A method of manufacturing a microfluidic device in which coating film patterns made of a coupling agent are formed in microchannels, the method comprising:

forming coating film patterns made of a coupling agent on a Si substrate;

selectively oxidizing coupling agent-free regions of the Si substrate having thereon the coating film patterns made of the coupling agent using an oxidizing agent with an oxidation potential from 1 to 2 V; and adhering a PDMS (polydimethylsiloxane) microchannel structure to the selectively oxidized Si substrate to form the microchannels containing the patterns of the coupling agent.

2. The method of claim 1, wherein the formation of the coating film patterns made of the coupling agent is performed using photolithography.

3. The method of claim 2, wherein the formation of the coating film patterns made of the coupling agent using photolithography comprises:

forming $SiO_2$ oxide film patterns on the Si substrate; and selectively coating the coupling agent on the $SiO_2$ oxide film patterns.

4. The method of claim 1, wherein in the adhesion of the PDMS microchannel structure to the selectively oxidized Si substrate, contact areas of the PDMS microchannel structure contacting with the Si substrate are treated with plasma.

5. The method of claim 1, wherein the Si substrate is a silicon wafer, a glass substrate, or a quartz substrate.

6. The method of claim 2, wherein the coupling agent is a compound represented by Formula 1 below:

wherein,

A is SH, OH, CHO, $NH_2$, COOH, or epoxy;

m is an integer from 1 to 10; and $X^1$, $X^2$, and $X^3$ are each independently $C_{1-6}$ alkyl, $C_{1-6}$ alkoxy, or halogen, and at least one of $X^1$, $X^2$, and $X^3$ is $C_{1-6}$ alkoxy or halogen.

7. The method of claim 6, wherein the compound of Formula 1 is ɤ-aminopropyltriethoxysilane, 3-glycidoxypropyltriethoxysilane, or 5,6-epoxyhexyltriethoxysilane.

8. The method of claim 1, wherein the oxidizing agent is selected from the group consisting of hydrogen peroxide, potassium permanganate, tetramethylammonium hydroxide, and a combination thereof.

* * * * *